(12) United States Patent
Macerola

(10) Patent No.: US 12,001,233 B2
(45) Date of Patent: Jun. 4, 2024

(54) BALANCING CURRENT CONSUMPTION BETWEEN DIFFERENT VOLTAGE SOURCES

(71) Applicant: Micron Technology, Inc., Boise, ID (US)

(72) Inventor: Agostino Macerola, San Benedetto dei Marsi (IT)

(73) Assignee: Micron Technology, Inc., Boise, ID (US)

( * ) Notice: Subject to any disclaimer, the term of this patent is extended or adjusted under 35 U.S.C. 154(b) by 272 days.

(21) Appl. No.: 17/684,909

(22) Filed: Mar. 2, 2022

(65) Prior Publication Data

US 2022/0390972 A1 Dec. 8, 2022

Related U.S. Application Data

(60) Provisional application No. 63/196,555, filed on Jun. 3, 2021.

(51) Int. Cl.
*G05F 1/575* (2006.01)
*G05F 1/56* (2006.01)
*G05F 1/563* (2006.01)
*G11C 5/14* (2006.01)

(52) U.S. Cl.
CPC .............. *G05F 1/575* (2013.01); *G05F 1/562* (2013.01); *G05F 1/563* (2013.01); *G11C 5/148* (2013.01)

(58) Field of Classification Search
CPC .. G05F 1/575; G05F 1/562–563; G11C 5/148
See application file for complete search history.

(56) References Cited

U.S. PATENT DOCUMENTS

| | | | | |
|---|---|---|---|---|
| 9,823,678 | B1* | 11/2017 | Lin | H03F 3/45475 |
| 9,917,513 | B1* | 3/2018 | Le | G05F 1/56 |
| 10,615,691 | B1* | 4/2020 | Miller | G05F 1/62 |
| 2015/0214838 | A1* | 7/2015 | Tomioka | G05F 1/56 |
| | | | | 323/282 |
| 2019/0004938 | A1* | 1/2019 | Siciliani | G11C 11/5642 |
| 2022/0229455 | A1* | 7/2022 | Zhong | G05F 3/262 |
| 2022/0405002 | A1* | 12/2022 | Macerola | G11C 7/04 |
| 2023/0037884 | A1* | 2/2023 | Vali | G11C 16/102 |
| 2023/0111614 | A1* | 4/2023 | Macerola | G11C 16/0483 |
| | | | | 365/185.18 |

FOREIGN PATENT DOCUMENTS

EP 3933543 A1 * 1/2022 ............. G05F 1/565

* cited by examiner

*Primary Examiner* — Sisay G Tiku
(74) *Attorney, Agent, or Firm* — Lowenstein Sandler LLP

(57) ABSTRACT

An apparatus includes a voltage regulator coupled with a first voltage source, which supplies core memory circuitry. A first transistor is coupled between an output of the voltage regulator and input/output (I/O) circuitry. A second transistor is coupled between a second voltage source and the I/O circuitry, the second voltage source to power a set of I/O buffers. Control logic coupled with gates of the first and second transistors is to perform operations including: causing the second transistor to be activated to permit current to flow from the second voltage source to the I/O circuitry; in response to detecting a current draw from the I/O circuitry that satisfies a first threshold criterion, causing the first transistor to be activated; and causing the second transistor to be deactivated over a time interval during which the I/O circuitry is powered by the first voltage source and the second voltage source.

20 Claims, 11 Drawing Sheets

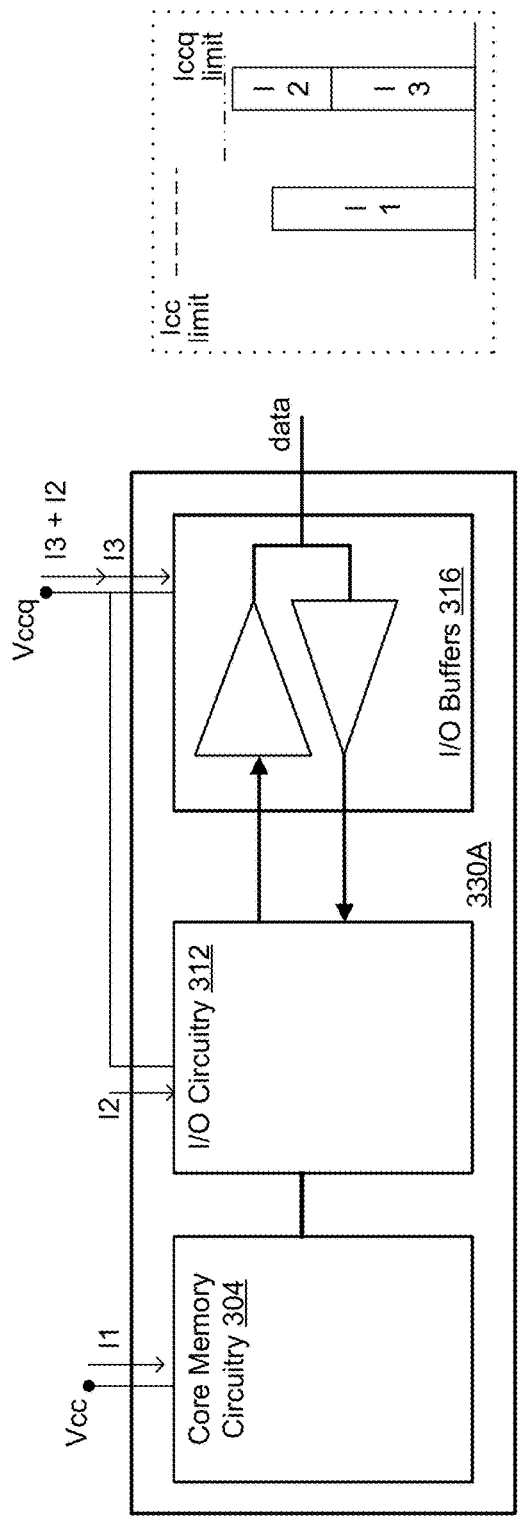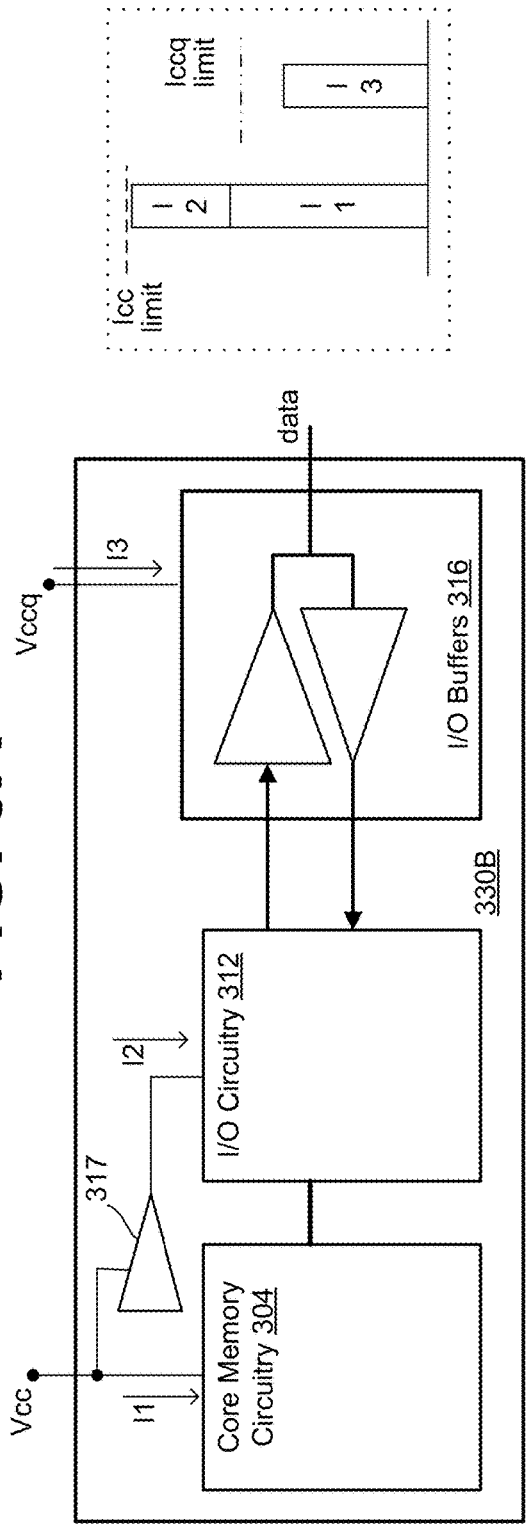
FIG. 3A
FIG. 3B

BALANCING CURRENT CONSUMPTION BETWEEN DIFFERENT VOLTAGE SOURCES

REFERENCE TO RELATED APPLICATION

This application claims the benefit of U.S. Provisional Patent Application No. 63/196,555, filed Jun. 3, 2021, the entirety of which is incorporated herein by reference.

TECHNICAL FIELD

Embodiments of the disclosure relate generally to memory sub-systems, and more specifically, relate to balancing current consumption between different voltage sources.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 3A is a block diagram of a memory device in which input/output (I/O) circuitry is powered by a smaller of two voltage sources according to an embodiment.

FIG. 3B is a block diagram of the memory device in which the I/O circuitry is powered by a larger of the two voltage sources according to another embodiment.

DETAILED DESCRIPTION

Figure 1:
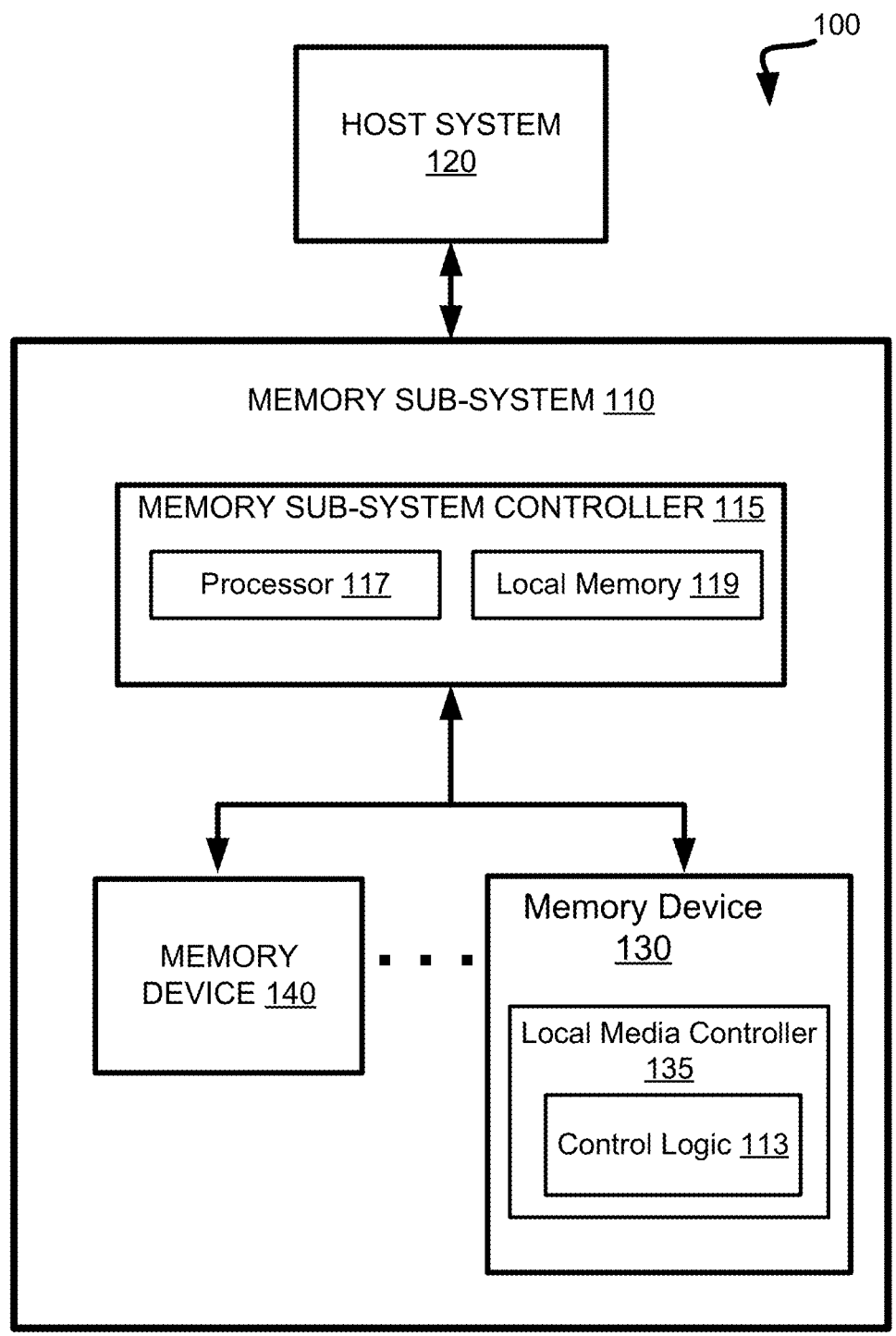
FIG. 1 is an example computing system that includes a memory sub-system in accordance with some embodiments.

Aspects of the present disclosure are directed to relate to balancing current consumption between different voltage sources. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below with reference to FIG. 1. A non-volatile memory device is a package of one or more memory dies. Each die can include one or more planes. For some types of non-volatile memory devices (e.g., NAND devices), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1," or combinations of such values.

In certain memory devices, the memory cells and other core memory circuitry (such as page buffers and the like) can be powered by a first voltage source while input/output (I/O) buffers are powered by an auxiliary (or second) voltage source. The first voltage source (e.g., voltage common collector, or Vcc) can generally have a higher voltage than that of the second voltage source, which is also referred to as Vccq herein. The second voltage source (Vccq) can be adapted to power the I/O buffers, and in some cases, I/O circuitry as well that is coupled between the core memory circuitry and the I/O buffers. Thus, I/O circuitry can be viewed as large data serializers that move data back and forth between NAND core circuits and the I/O buffers.

In some memory devices, if the current budget limit (e.g., Iccq) from the second voltage source is sufficient to drive the I/O circuits in addition to the I/O buffers, then all of the power can be provided by the second voltage source. If, however, the current budget limit from the second voltage source is insufficient to drive the I/O circuits, which will be the case in larger memory devices as the I/O circuitry increases, then all of the power can be provided by the first voltage source (Vcc). Driving the I/O circuitry only with the first voltage source (instead of the second voltage source) can carry certain power losses, requires use of a dedicated voltage regulator, which in turn employs a large decapacitive filter. Further, use of the voltage regulator can introduce design issues related to turning on times and output voltage stability, which will be discussed in more detail.

Aspects of the present disclosure address the above and other deficiencies by providing a memory device that enables selective use of both the first and second voltage sources, including a transition period (e.g., hybrid mode) when switching from the second voltage source to the first voltage source so that the first voltage source can be slowly ramped down during a time interval. Once the first voltage source is providing a sufficient current to power the I/O circuitry, control logic can remove sourcing power from the second voltage source. In response to detecting a drop in current supplied to the I/O circuitry that is sufficiently large that the second voltage source can again be a sole source of power supply, the control logic can switch back to the second voltage source supplying power and shutting off the path from the first voltage source.

More specifically, in various embodiments, a voltage regulator is coupled with the first voltage source (Vcc) and a first transistor (e.g., a first switch) is coupled between an output of the voltage regulator and the I/O circuitry of the memory device. A second transistor (e.g., a second switch) can be coupled between a second voltage source (Vccq) and the I/O circuitry. Further, control logic can be coupled with gates of the first transistor and the second transistor. The control logic can perform operations that cause the second transistor to be activated to permit current to flow from the second voltage source to the I/O circuitry, e.g., upon startup of the memory device. In response to detecting a current draw from the I/O circuitry that satisfies a first threshold criterion, the control logic can cause the first transistor to be activated. The control logic can further cause the second transistor to be deactivated (e.g., using a linearly decreasing ramp signal) over a time interval during which the I/O circuitry is powered by the first voltage source and the second voltage source, e.g., in the hybrid mode.

In these embodiments, upon the voltage provided to the I/O circuitry by the first voltage source exceeding that provided by the second voltage source, the control logic causes the second transistor to be fully deactivated, e.g., to enter an amplifier mode. The voltage regulator can be an operational amplifier to allow feedback mechanism to control offset cancellation. Upon detecting a drop in the current draw of the I/O circuitry satisfy a second threshold criterion, the control logic can cause the first transistor to be fully deactivated and the second transistor to be fully activated to return to a shorted mode in which the first voltage source does not aid in providing power to the I/O circuitry.

Therefore, advantages of the systems and methods implemented in accordance with some embodiments of the present disclosure include, but are not limited to, avoiding the above listed disadvantages for staying in a mode of powering the I/O circuitry with the first voltage source (Vcc) all of the time while enabling smooth transition into such a mode when needed to meet current draw from the I/O circuitry. Thus, the selective use of both of the voltage sources enables transitioning back to providing power by the second voltage source (Vcc), which is more power efficient, when the first power source is not required. Other advantages will be discussed and still others will be apparent to those skilled in the art having the benefit of this disclosure.

FIG. 1 illustrates an example computing system 100 that includes a memory sub-system 110 in accordance with one or more embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address (e.g., logical block address (LBA), namespace) and a physical block address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In one embodiment, the memory device 130 includes control logic 113 that can be used to receive feedback from current supplied to the I/O circuitry and control gates of the first and second transistors that selectively enable use of two different voltage sources. This selective control by the control logic 113 can, for example, depend on current budget limits of each voltage source and an amount of current draw from the I/O circuitry that can be powered by either or both of the first and second voltage sources.

Figure 2:
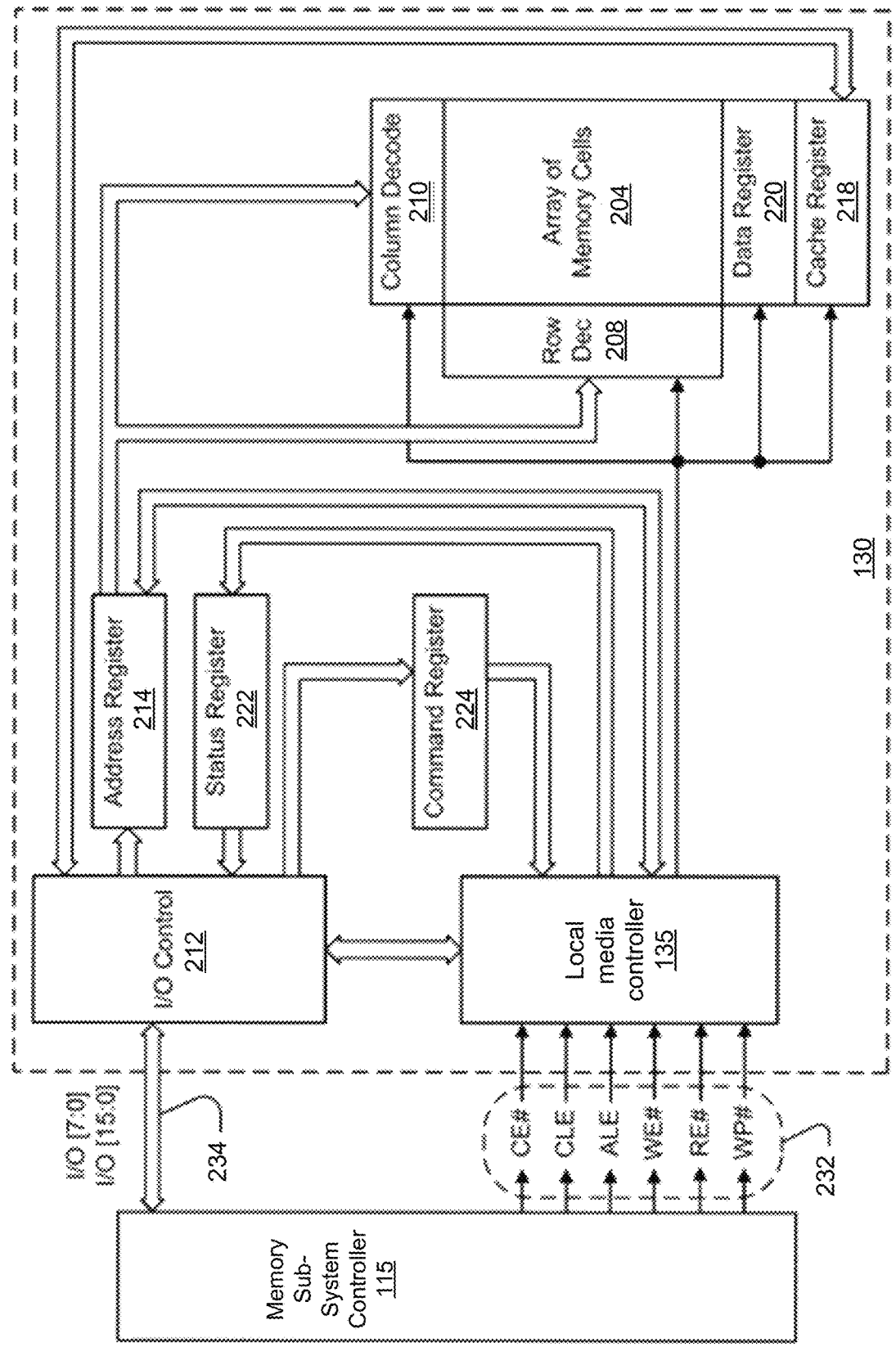
FIG. 2 is a block diagram of a memory device in communication with a memory sub-system controller of a memory sub-system according to an embodiment.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device.

Memory device 130 includes an array of memory cells 204 logically arranged in rows and columns. Memory cells of a logical row are typically connected to the same access line (e.g., a wordline) while memory cells of a logical column are typically selectively connected to the same data line (e.g., a bit line). A single access line can be associated with more than one logical row of memory cells and a single data line can be associated with more than one logical column. Memory cells (not individually illustrated) of at least a portion of array of memory cells 204 are capable of being programmed to one of at least two target data states.

Row decode circuitry 208 and column decode circuitry 210 are provided to decode address signals. Address signals are received and decoded to access the array of memory cells 204. Memory device 130 also includes input/output (I/O) control circuitry 212 to manage input of commands, addresses and data to the memory device 130 as well as output of data and status information from the memory device 130. An address register 214 is in communication with I/O control circuitry 212 and row decode circuitry 208 and column decode circuitry 210 to latch the address signals prior to decoding. A command register 224 is in communication with I/O control circuitry 212 and control logic 216 to latch incoming commands.

A controller (e.g., the local media controller 135 internal to the memory device 130) controls access to the array of memory cells 204 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 208 and column decode circuitry 210 to control the row decode circuitry 208 and column decode circuitry 210 in response to the addresses. The local media controller 135 can also be coupled with the I/O control circuitry 212, other I/O circuitry, as well as I/O buffers that buffer data being stored into or read out of the array of memory cells 204.

The local media controller 135 is also in communication with a cache register 218. Cache register 218 latches data, either incoming or outgoing, as directed by the local media controller 135 to temporarily store data while the array of memory cells 204 is busy writing or reading, respectively, other data. During a programming operation (e.g., write operation), data can be passed from the cache register 218 to the data register 22 for transfer to the array of memory cells 204; then new data can be latched in the cache register 218 from the I/O control circuitry 212. During a read operation, data can be passed from the cache register 218 to the I/O control circuitry 212 for output to the memory sub-system controller 115; then new data can be passed from the data register 220 to the cache register 218. The cache register 218 and/or the data register 220 can form (e.g., can form a portion of) a page buffer of the memory device 130. A page buffer can further include sensing devices (not shown in FIG. 2) to sense a data state of a memory cell of the array of memory cells 204, e.g., by sensing a state of a data line connected to that memory cell. A status register 222 can be in communication with I/O control circuitry 212 and the local memory controller 135 to latch the status information for output to the memory sub-system controller 115.

Memory device 130 receives control signals at the memory sub-system controller 115 from the local media controller 135 over a control link 232. For example, the control signals can include a chip enable (CE #), a command latch enable (CLE), an address latch enable (ALE), a write enable (WE #), a read enable (RE #), and a write protect (WP #). Additional or alternative control signals (not shown) can be further received over control link 232 depending upon the nature of the memory device 130. Memory device 130 receives command signals (which represent commands), address signals (which represent addresses), and data signals (which represent data) from the memory sub-system controller 115 over a multiplexed input/output (I/O) bus 234 and outputs data to the memory sub-system controller 115 over I/O bus 234.

For example, the commands can be received over input/output (I/O) pins [7:0] of I/O bus 234 at I/O control circuitry 212 and can then be written into command register 224. The addresses can be received over input/output (I/O) pins [7:0] of I/O bus 234 at I/O control circuitry 212 and can then be written into address register 214. The data can be received over input/output (I/O) pins [7:0] for an 8-bit device or input/output (I/O) pins [15:0] for a 16-bit device at I/O control circuitry 212 and then can be written into cache register 218. The data can be subsequently written into data register 220 for programming the array of memory cells 204.

In an embodiment, cache register 218 can be omitted, and the data can be written directly into data register 220. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2.

Additionally, while specific I/O pins are described in accordance with popular conventions for receipt and output of the various signals, it is noted that other combinations or numbers of I/O pins (or other I/O node structures) can be used in the various embodiments.

FIG. 3A is a block diagram of a memory device 330A in which input/output (I/O) circuitry 312 is powered by a smaller of two voltage sources according to an embodiment. FIG. 3B is a block diagram of the memory device 330B in which the I/O circuitry 312 is powered by a larger of the two voltage sources according to another embodiment. Each of the memory devices 330A and 330B can include core memory circuitry 304, a set of I/O buffers 316, and the I/O circuitry 312, which is coupled between the core memory circuitry 304 and the I/O buffers 316. The core memory circuitry 304 can include the array of memory cells 204, page buffers, and cache, among other circuitry discussed with reference to FIG. 2. The I/O circuitry 312 can include the I/O control circuitry 212 along with other I/O circuitry that can be understood to operate as large data serializers to move data back and forth between the core memory circuitry 304 and the I/O buffers 316. The I/O buffers 316 will buffer data as it waits to either be written to the core memory circuitry 304 or read out of the core memory circuitry 304 and sent to the host system 120, for example.

In various embodiments, a first voltage source is a voltage common collector (Vcc) source that provides the main power to the core memory circuitry 304, which is the largest consumer of power. In some embodiments, a second voltage source (or Vccq) is also provided in order to power the I/O buffers 316 and optionally also the I/O circuitry. The first voltage source can therefore generally have a higher voltage than that of the second voltage source, and thus can supply more current or power in the case of more power-hungry I/O circuits.

In the embodiment of FIG. 3A, a current required by the core memory circuitry 304 is a first current (I1), a current required by the I/O circuitry 312 can be a second current (I2), and a current required by the I/O buffers 316 can be a third current (I3) for ease of explanation. As is indicated by the right-most diagram of FIG. 3A, the current budget limit of Vccq is the Iccq limit, which can handle the currents I2 and I3. While currents I2 and I3, as combined, are close to the Iccq limit, there is sufficient current budget limit, and thus, this embodiment may not need the help from the larger voltage of Vcc.

In another embodiment, FIG. 3B illustrates how the combined currents I2 and I3 would have exceeded the current budget limit of Iccq. Thus, powering the I/O circuitry 312 can be switched to being powered by the first voltage source (Vcc). In this embodiment, the memory device 330B further includes a voltage regulator 317 coupled between Vcc and the I/O circuitry 312. The voltage regulator 317 can regulate the voltage from Vcc to supply the second current I2 while Vcc also supplies the first current, which the Icc current limit can meet, as illustrated by the right-most diagram in FIG. 3B. Use of the voltage regulator 317, however, can carry certain power losses and voltage processing requirements. Further, use of the voltage regulator 317 can introduce design issues related to turning on times and output voltage stability. For example, the voltage regulator 317 may not be able to supply power during standby and idle modes. Further, the voltage regulator 317 would need to react quickly to supply additional voltage, but is the type of electrical component that does not turn on quickly. Finally, the voltage regulator 317 would need to avoid voltage ringing and transients while the regulator turns on, e.g., which would requires a large decapacitive filter to manage. Thus, there are disadvantages with employing the voltage regulator 317 at startup and as a permanent solution to managing the provision of power supply to the I/O circuitry 312.

Figure 4:
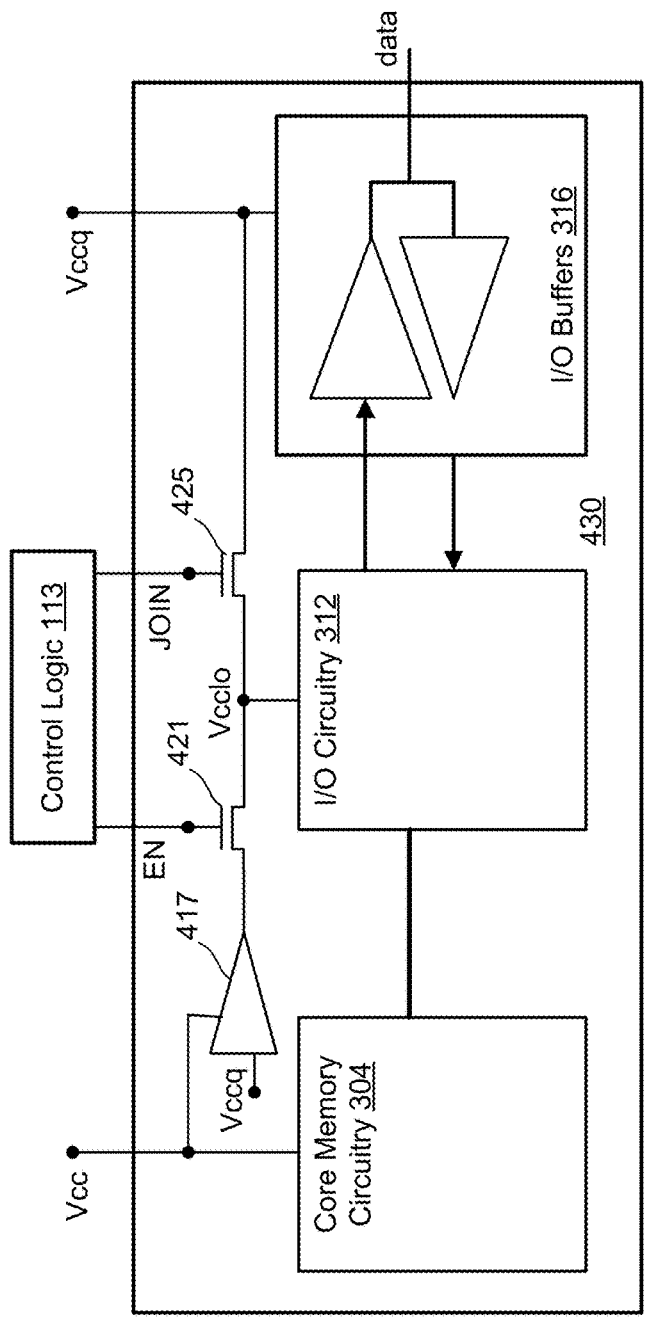
FIG. 4 is a schematic block diagram of a memory device in which the I/O circuitry is selectively powered by both of the two voltage sources according to an embodiment.

FIG. 4 is a schematic block diagram of a memory device 430 in which the I/O circuitry 312 is selectively powered by both of the two voltage sources according to an embodiment. These two voltage sources (or power supplies) can include the first voltage source (Vcc) and second voltage source (Vccq) previously discussed herein. The memory device 320 can include a voltage regulator 417, which can be an operational amplifier, to supply the first voltage source (Vcc) to the I/O circuitry 312. In one embodiment, the voltage regulator 417 is the voltage regulator 317 of FIG. 3B. The voltage regulator 417 can receive the second voltage source (Vccq) in order to perform offset cancellation, as will be described in more detailed with reference to FIG. 6.

In various embodiments, the memory device 430 includes a first transistor 421 (or first switch) coupled between an output of a voltage regulator 417 and the I/O circuitry 312 of the memory device 430. The memory device 430 can further include a second transistor 425 (or second switch) coupled between the second voltage source (Vccq) and the I/O circuitry 312, the second voltage source to power a set of I/O buffers 316. Because the first transistor 421 and the second transistor 425 are each coupled with the I/O circuitry 312, a source terminal of each of the first and second transistors 421 and 425 are coupled together as well at node Vcclo leading to the I/O circuitry 312. A drain of the first transistor 417 can be coupled with the voltage regulator 417 and a drain of the second transistor 425 can be coupled with the second voltage source (Vccq). In some embodiments, the first transistor 421 and the second transistor 425 are each an n-type complementary metal-oxide-semiconductor (NMOS) transistor. In other embodiments, the first transistor 421 and the second transistor 425 are each a p-type complementary metal-oxide-semiconductor (PMOS) transistor.

Figure 5:
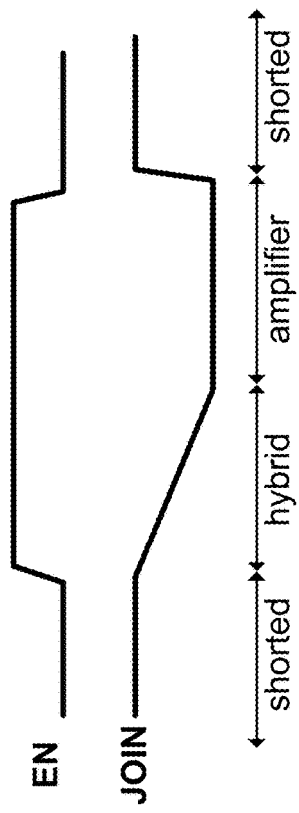
FIG. 5 is a graph illustrating plots of control logic signals provided to transistors coupled with each of the two voltage sources of FIG. 4 according to an embodiment.

FIG. 5 is a graph illustrating plots of control logic signals provided to first and second transistors 421 and 425 coupled with each of the two voltage sources of FIG. 4 according to an embodiment. In various embodiments, the memory device 430 further includes the control logic 113 coupled with gates of the first transistor 421 ("EN") and the second transistor 425 ("JOIN"), in order to facilitate selective transfer of power supply sourcing between the first and second voltage sources. The control logic 113 can be adapted to perform operations, which include causing the second transistor 425 to be activated to permit current to flow from the second voltage source (Vccq) to the I/O circuitry 412. Having only the second transistor 425 activated is illustrated as the first "shorted" period in FIG. 5, indicative of the low-resistive path provided between Vccq and Vcclo.

With additional reference to FIGS. 4-5, the operations performed by the control logic 113 can further include, in response to detecting a current draw from the I/O circuitry 312 that satisfies a first threshold criterion, causing the first transistor to be activated. The first threshold criterion can include meeting a predetermined current value that exceeds current budget limit for the second current drawn from the second voltage source (Vccq). This "hybrid" period of time illustrated in FIG. 5 enables the memory device 430 to provide current to the I/O circuitry 312 from both Vcc and Vccq. The operations can further include causing the second transistor 425 to be deactivated over a time interval during which the I/O circuitry 312 is powered by the first voltage source (Vcc) and the second voltage source (Vccq), e.g., the hybrid period. In one embodiment, the control logic 113 can slowly deactivate the second transistor 425. For example, the control logic 113 can cause the second transistor 425 to be ramped linearly from being fully activated to being fully deactivated. By slowly deactivating (or turning) off the second transistor 425, the voltage regulator 417 can effectively ramp up to providing a higher voltage, and thus enable the voltage regulator 417 to be stable in initializing an output of the voltage regulator 417. In this way, the voltage regulator 417 avoids the need to turn on quickly, avoids ringing and transients, and the need for large decapacitive circuitry. For example, a small capacitor on an output of the regulator amplifier 417 can be sufficient to absorb any voltage surge.

With continued reference to FIGS. 4-5, the operations can further include detecting when the voltage at Vcclo goes higher than an output of the voltage regulator 417 (e.g., a negative voltage), after which the operations can include causing the second transistor 425 to be fully deactivated. The deactivation of the second transistor 425 can mark an end of the hybrid period or operation in the hybrid mode. The memory device 430 can thus enter into the "amplifier" period or amplifier mode of operation in which only the first voltage source (Vcc) provides power supply to the I/O circuitry 312. The operations can further include detecting a drop in the current draw of the I/O circuitry 312 that satisfies a second threshold criterion. This second criterion can include dropping below a predetermined current in which the voltage demand on the two voltage sources can be shifted back to the shorted period or mode of operation. Thus, the operations further include causing the first transistor 421 to be fully deactivated and causing the second transistor 425 to be fully activated. In this way, the control logic 113 can direct powering the I/O circuitry 312 selectively and smoothly between the first and second voltage sources, e.g., which are two different power domains.

Figure 6:
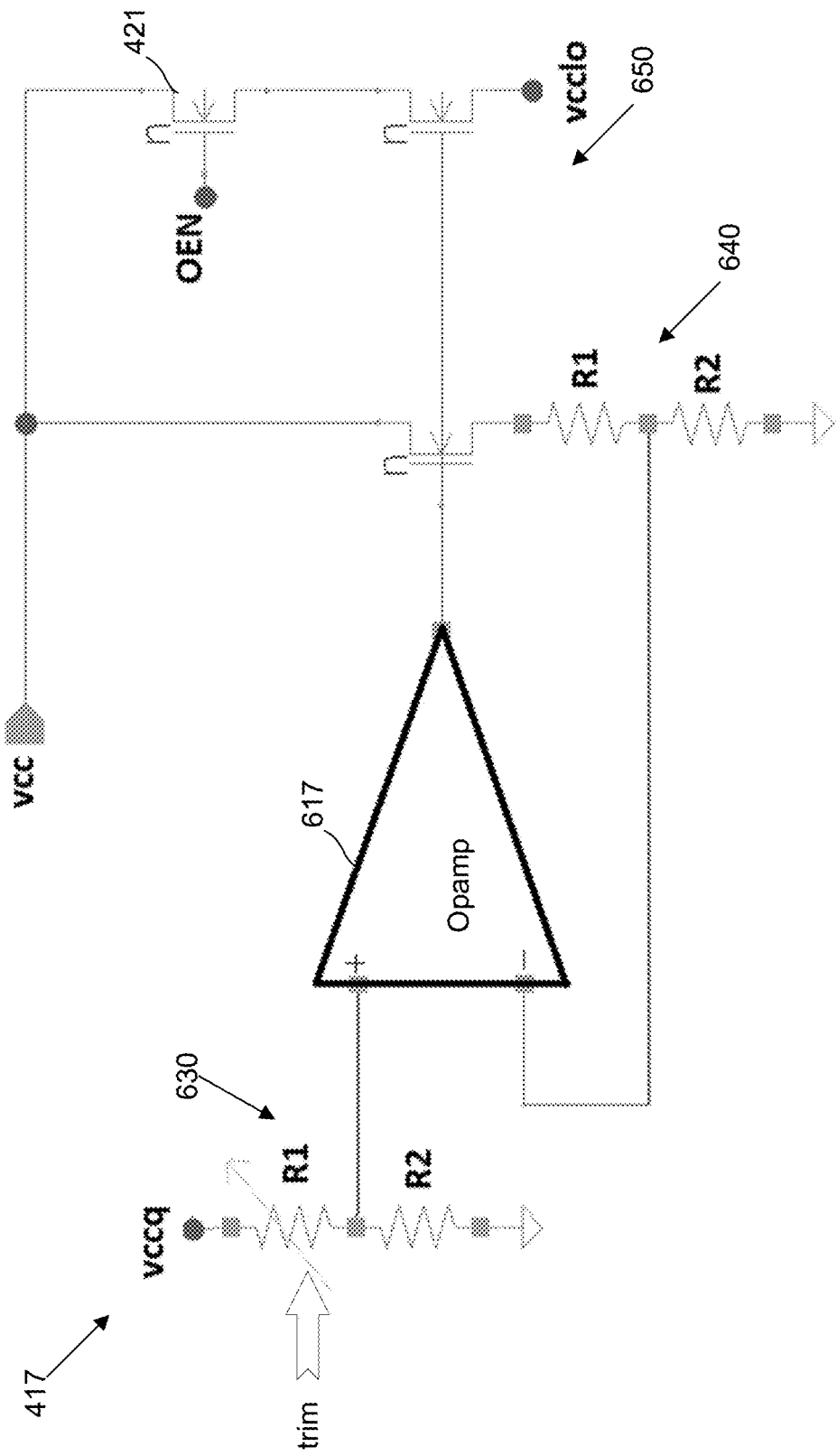
FIG. 6 is a schematic block diagram of a voltage regulator of the memory device of FIG. 4 according to an embodiment.

FIG. 6 is a schematic block diagram of the voltage regulator 417 of the memory device 430 of FIG. 4 according to an embodiment. In some embodiments, the voltage regulator 417 can include an operational amplifier 617, a first voltage divider 630 coupled between the second voltage source (Vccq) and a positive input terminal of the operational amplifier 617, and a second voltage divider 640 coupled between an output of the operational amplifier 617 and the negative input terminal of the operational amplifier 617. In one embodiment, a top resistor (R1) of the first voltage divider 630 is adjustable (and variable) with a trim value to set an offset cancellation of the operational amplifier that is within at least one percent of a voltage of the second voltage source. In one embodiment, the trim value is set so that the input voltage at the positive input terminal of the operational amplifier 617 is within several millivolts of a voltage supplied by the second voltage source (Vccq). The voltage regulator 417 can further include an output stage 650 that includes a bank of NMOS (or PMOS) transistors.

Figure 7A:
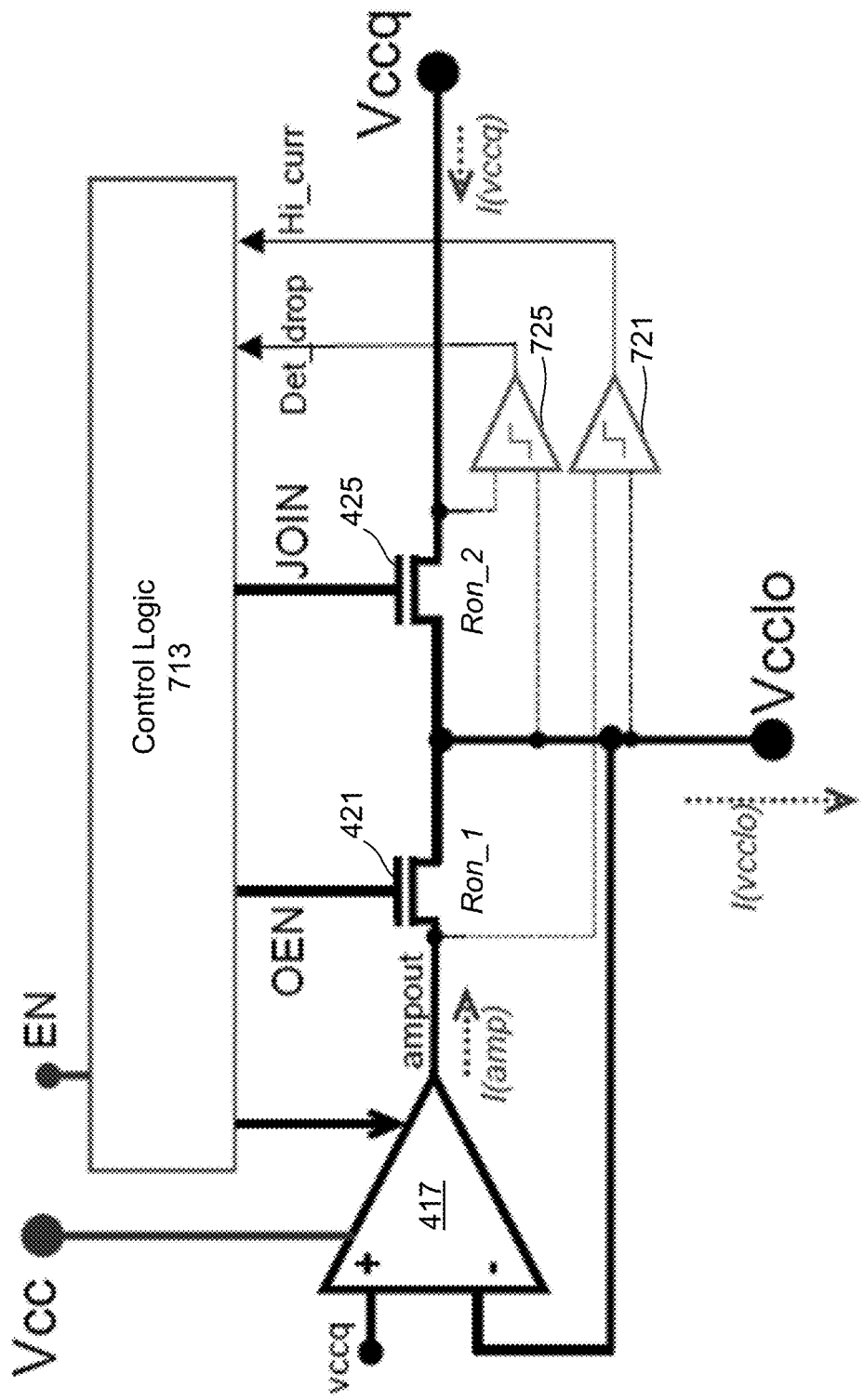
FIG. 7A is a schematic block diagram of a memory device in which the I/O circuitry is selectively powered by both of two voltage sources according to another embodiment.

FIG. 7A is a schematic block diagram of a memory device 730 in which the I/O circuitry is selectively powered by both of two voltage sources according to another embodiment. The memory device 730 can include control logic 713 that can be a part of or in addition to the control logic 113 referred to previously. As before, the control logic 713 can be coupled with gates of the first transistor 421 and the second transistor 425. The label Ron_1 refers to a small internal resistance of the first transistor 421 and the label Ron_2 refers to a small internal resistance of the second transistor 425. Further, the "ampout" signal can be understood to be an output of the voltage amplifier 417.

In various embodiments, the memory device 730 further includes a first comparator 721 with inputs from a drain and a source of the first transistor 421 and that provides an output signal (Hi_curr) by way of digital feedback to the control logic 713 indicating whether the second threshold criterion is satisfied. This second criterion can include I(Vcclo) dropping below a predetermined current in which the voltage demand on the two voltage sources can be shifted back to the shorted period or mode of operation. Having the first comparator 721 across the first transistor 421 can function as a current sense operation across Ron_1 at a voltage threshold of the first comparator 721. In one embodiment, the source input of the first comparator 721 is also connected to a feedback line to the negative input line of the voltage regulator 417.

In the various embodiments, the memory device 730 further includes a second comparator 725 with inputs from a drain and a source of the second transistor 425 and that provides an output signal (Det_drop) by way of digital feedback to the control logic 713 indicating whether the first threshold criterion is satisfied. The first threshold criterion can include meeting a predetermined current value that exceeds current budget limit (Iccq) for the second current drawn from the second voltage source (Vccq). Having the second comparator 725 across the second transistor 425 can function as a current sense operation across Ron_2 at a voltage threshold of the second comparator 725.

Figure 7B:
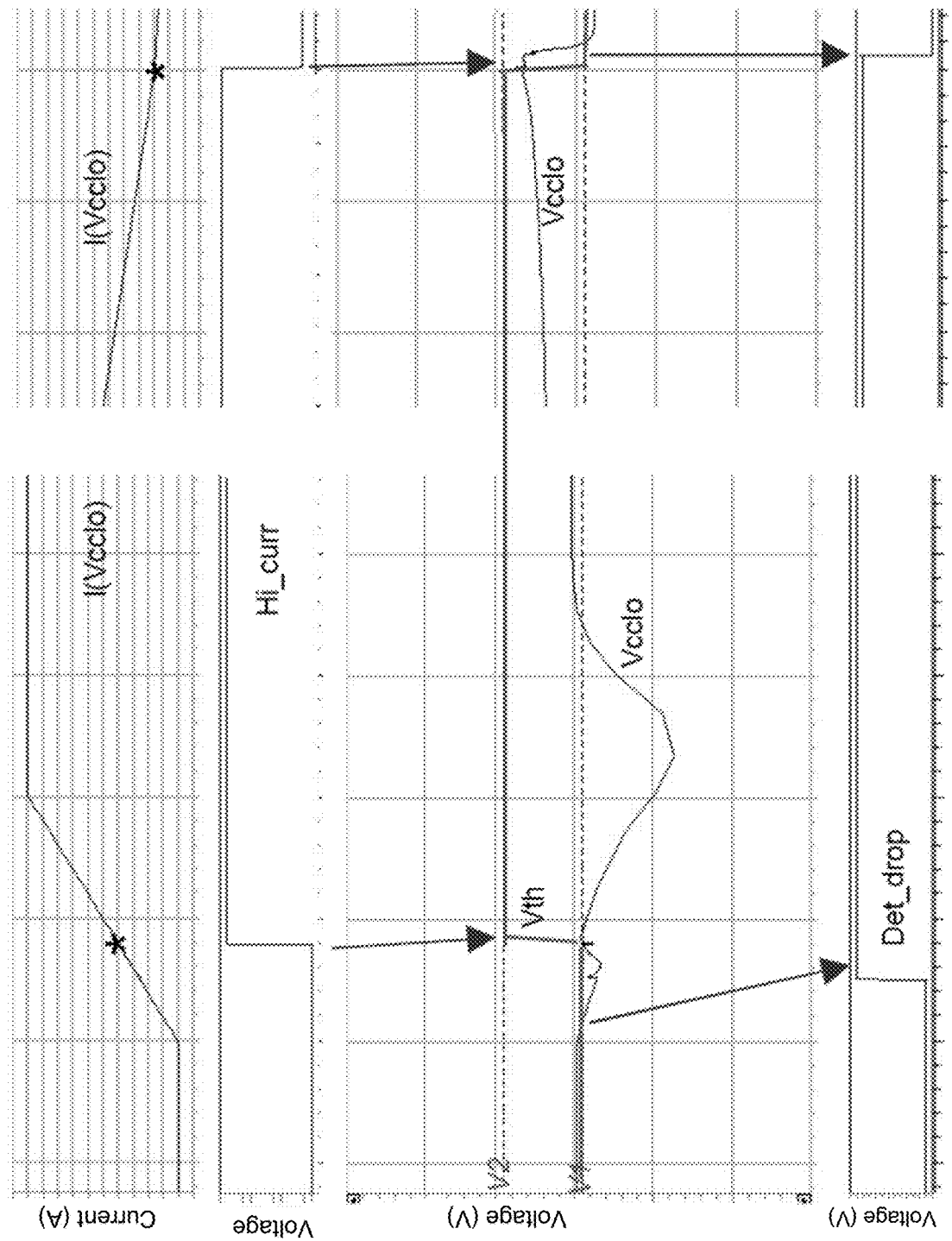
FIG. 7B is a graph illustrating plots associated with comparators that provide feedback to control logic in order to control an amount of current drawn by the I/O circuitry according to an embodiment.

FIG. 7B is a graph illustrating plots associated with comparators that provide feedback to control logic in order to control an amount of current drawn by the I/O circuitry 312 according to an embodiment. From top to bottom, the plots include the current I(Vcclo) drawn by the I/O circuitry 312, the output signal (Hi_Curr) from the first comparator 721, voltage level at Vcclo leading into the I/O circuitry 312 overlaid with threshold voltage (Vth) of the second comparator 725, and the output signal (Det_drop) from the second comparator 725. The voltage (V1) on the Vcclo plot in FIG. 7B can be assignable to allow to select a desired or preferred value of I(Vcclo) current at which current will begin to also be supplied by Vcc, e.g., in accordance with current budget limit specifications.

In these embodiments, with additional reference to FIG. 7A, when signal EN is zero, the voltage regulator 417 is OFF, signal OEN is zero, and signal JOIN is one while in the shorted mode. Further, when signal EN is one, the voltage regulator 417 is ON, and the first transistor 421 and the second transistor 425 are enabled according to the value of the I(Vcclo) current drawn by the I/O circuitry 312 and the switching sequence described in FIG. 8A.

Figure 8A:
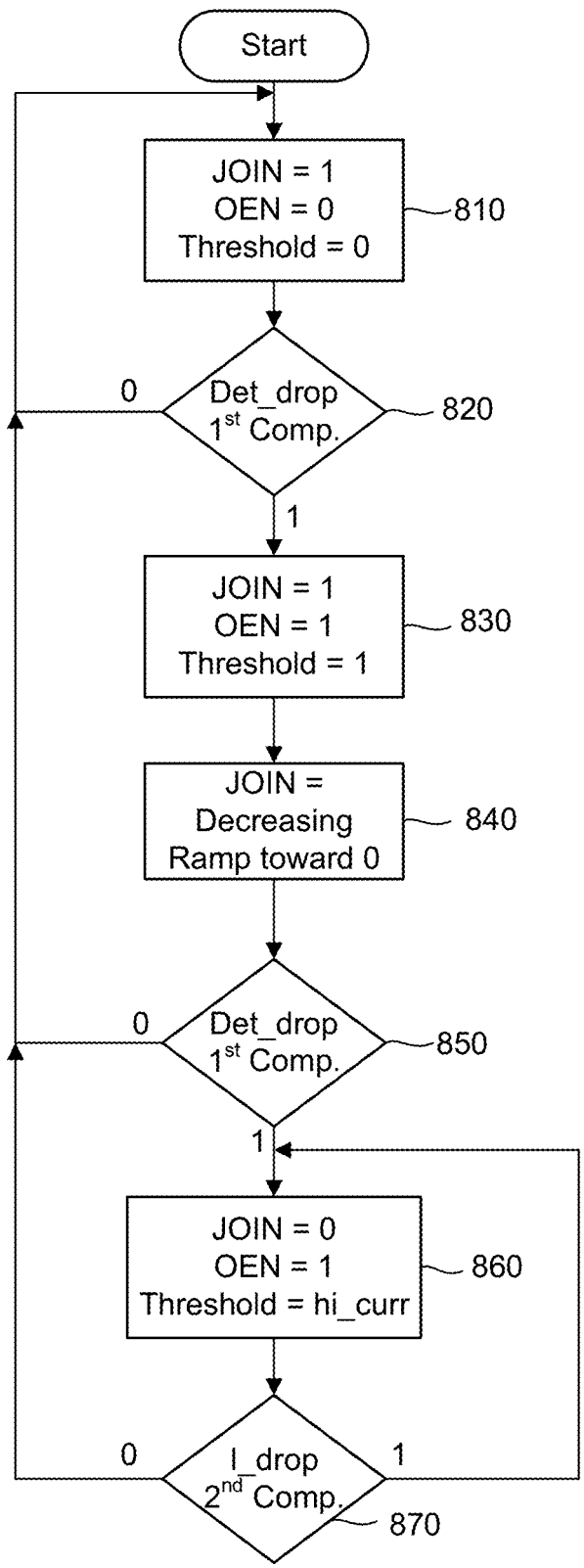
FIG. 8A is a flow diagram of an example method of selectively shifting powering the I/O circuitry with one or both of two voltage sources according to various embodiments.
Figure 8B:
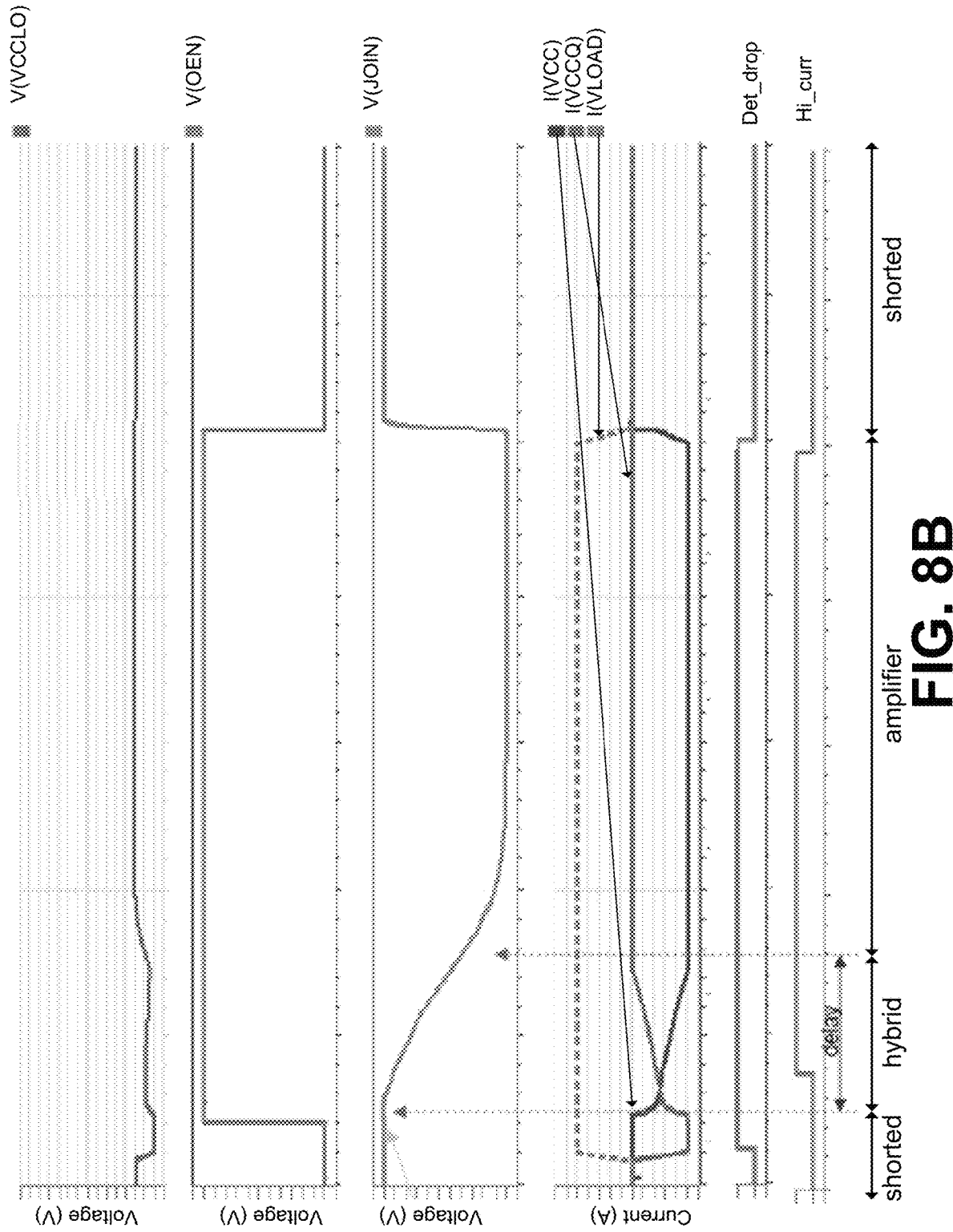
FIG. 8B is a graph illustrating plots of control signals, supply voltages, and supply and load currents associated with the memory devices discussed herein and the method of FIG. 8A according to various embodiments.

FIG. 8A is a flow diagram of an example method 800 of selectively shifting powering the I/O circuitry with one or both of two voltage sources according to various embodiments. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the control logic 113 and/or 713 and/or logic of the local media controller 135 of FIG. 1. FIG. 8B is a graph illustrating plots of control signals, supply voltages, and supply and load currents associated with the memory devices discussed herein and the method of FIG. 8A according to various embodiments.

Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 810, a memory device operates in a shorted mode. More specifically, the processing logic activates the second transistor 425 (with JOIN=1), keeps the first transistor 427 deactivated (with OEN=0), and a voltage threshold (Vt) of the second comparator 725 is set to zero ("0"). A zero, the Vt of the second comparator is at V1 (see FIG. 7B), which is some programmed positive voltage for transition to also providing power to the I/O circuitry 312 by the first voltage source (Vcc).

At operation 820, a voltage drop is determined. More specifically, the processing logic determines whether the output signal (Det_drop) of the second comparator 725 has been triggered, e.g., indicating that the first threshold criterion has been met. If the output signal of the second comparator 725 is not triggered (value of "0"), the method 800 flows back to operation 810. If the output signal of the second comparator 725 is triggered (value of "1" 0, the method 800 proceeds to the next operational mode.

At operation 830, the memory device transitions to a hybrid mode. More specifically, the processing logic activates the first transistor 421 (with OEN=1) while keeping the second transistor 425 activated (JOIN=1), e.g., operating in the hybrid mode. The processing logic also sets the voltage threshold (Vt) of the second comparator 725 to a one value ("1"). At a one value, the voltage threshold of the second comparator 725 can be a relatively small voltage value less than zero to trigger at detecting a negative voltage. A negative voltage indicates that a voltage output has exceeded that provided by the second voltage source (Vccq) alone and, therefore, Vccq is no longer required.

At operation 840, the second voltage source is ramped off. More specifically, the processing logic slowly deactivates the second transistor 425 during a time interval during which the I/O circuitry 312 is powered by the first voltage source (Vcc) and the second voltage source (Vccq), e.g., in hybrid mode. For example, the processing logic can cause the JOIN signal to linearly or progressively ramp toward zero to provide a smooth transition of supplying power over to the voltage regulator 417 in amplifier mode.

At operation 850, a voltage drop is determined. More specifically, the processing logic determines whether the output signal (Det_drop) of the second comparator 725 has been triggered (value of "1"), e.g., indicating that the newly set voltage threshold (Vt) has been meet. Upon meeting this new Vt, the hybrid mode can end as contribution from Vccq is no longer needed, and the memory device can enter the amplifier mode. If this value is not met (value of "0"), the method 800 can loop back to operation 810 and effectively start over.

At operation 860, the memory device transitions to amplifier mode. More specifically, the processing logic deactivates the second transistor 425 (JOIN=0), so that the decreasing ramp of the JOIN signal can be cut off, and retain the first transistor 421 in activation (OEN=1). Further, the processing logic now looks to the output signal (hi_curr) of the first comparator 721 to detect a triggered threshold.

At operation 870, a current drop is detected. More specifically, the processing logic determines whether a drop in the current draw of the I/O circuitry 312 is detected. As long as the current remains sufficiently high, the output signal (hi_curr) will remain a one value ("1") and continue to loop through operation 860. In response to a sufficient drop in the current draw (e.g., meeting the second threshold criterion), however, the threshold voltage (Vt) of the first comparator 721 will trigger to an output signal (hi_curr) of a zero value ("0"). In response to an output of zero, the method will loop back to operation 810 and effectively start over, putting the memory device back into the shorted mode.

Figure 9:
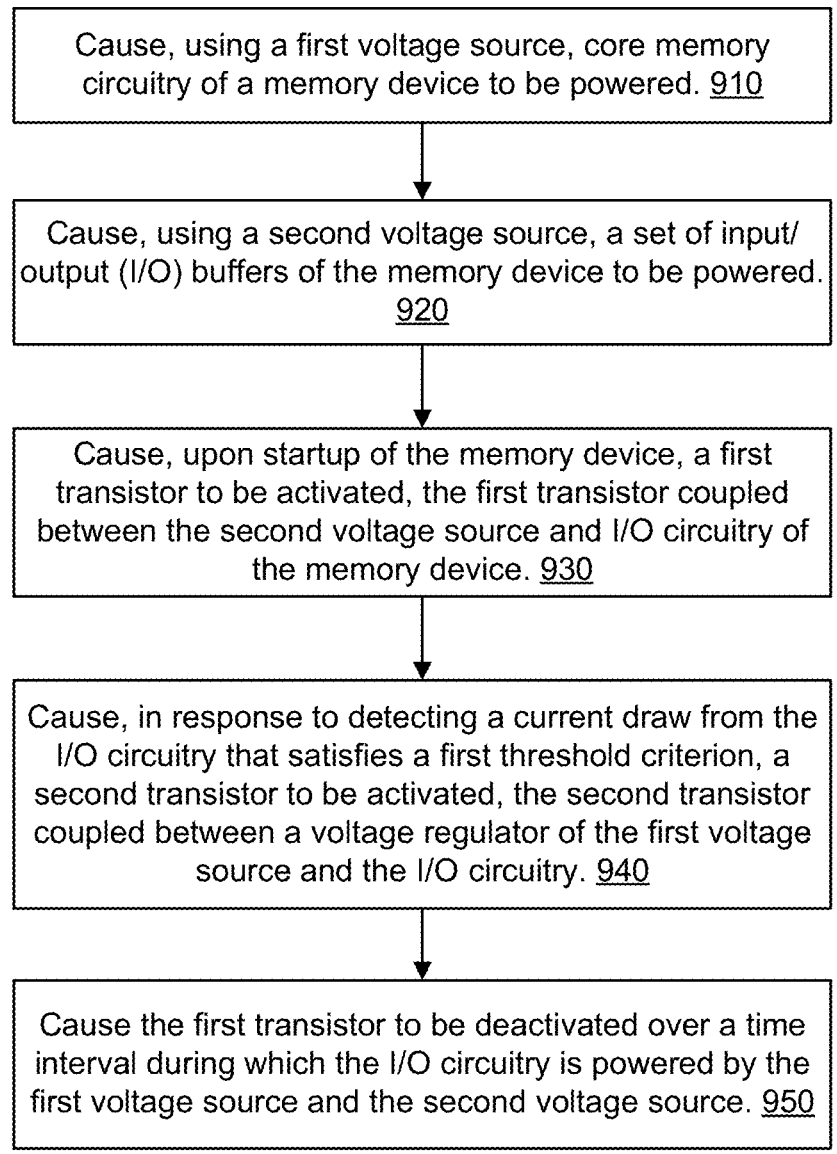
FIG. 9 is a flow diagram of an example method of selectively shifting powering the I/O circuitry from one to both of two voltage sources according to an embodiment.

FIG. 9 is a flow diagram of an example method 900 of selectively shifting powering the I/O circuitry from one to both of two voltage sources according to an embodiment. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the control logic 113 and/or 713 and/or logic of the local media controller 135 of FIG. 1.

Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 910, a first voltage source is employed. More specifically, a memory device causes, using the first voltage source (Vcc), core memory circuitry of a memory device to be powered.

At operation 920, a second voltage source is employed. More specifically, the memory device causes, using a second voltage source (Vccq), a set of input/output (I/O) buffers of the memory device to be powered.

At operation 930, a shorted mode of operation is entered. More specifically, the processing logic of the memory device causes, upon startup of the memory device, a first transistor to be activated, the first transistor coupled between the second voltage source and I/O circuitry of the memory device.

At operation 940, the memory device transitions to a hybrid mode. More specifically, the processing logic causes, in response to detecting a current draw from the I/O circuitry that satisfies a first threshold criterion, a second transistor to be activated, the second transistor coupled between a voltage regulator of the first voltage source and the I/O circuitry.

At operation 950, the memory device passes through the hybrid mode. More specifically, the processing logic causes the first transistor to be deactivated over a time interval during which the I/O circuitry is powered by the first voltage source and the second voltage source.

Figure 10:
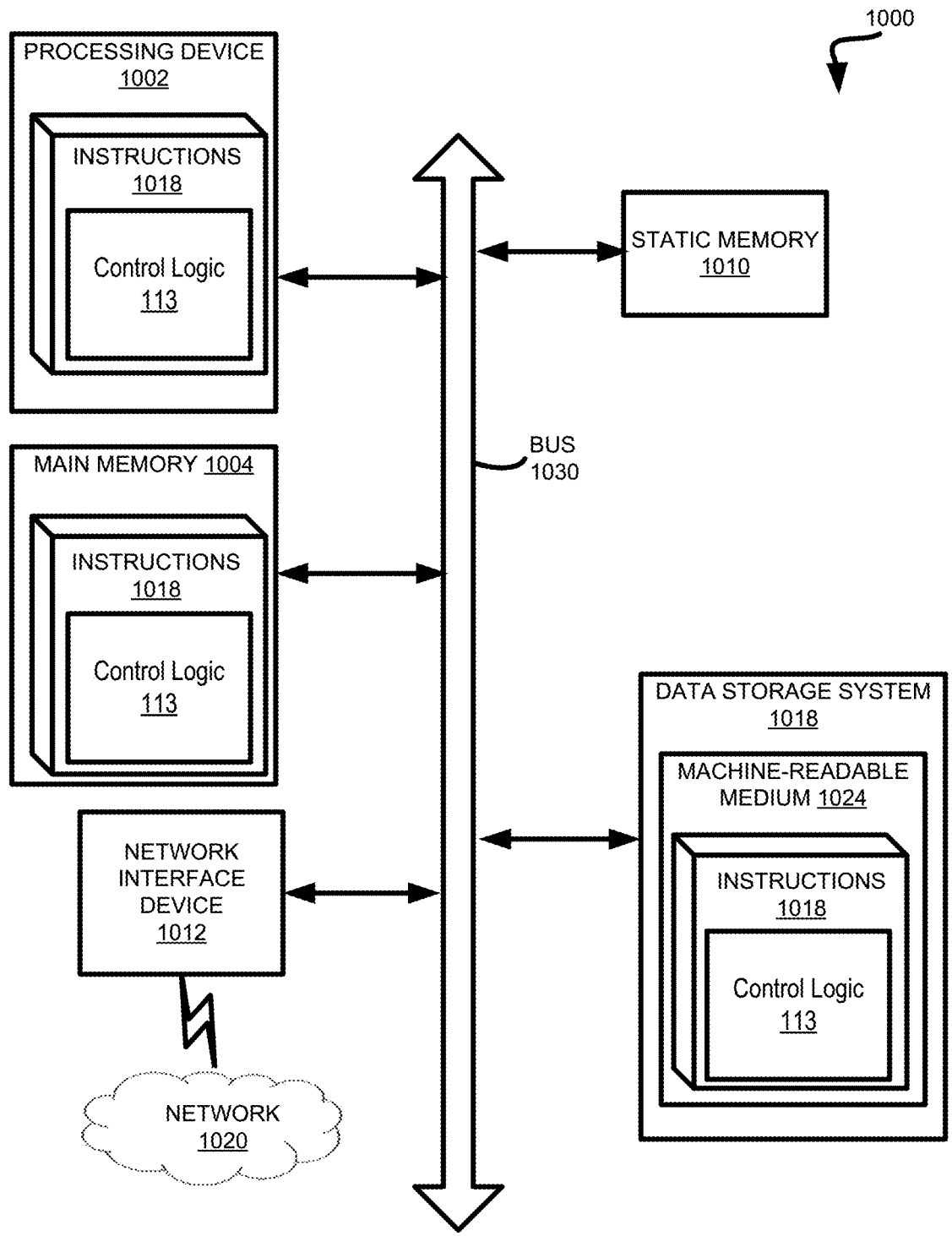
FIG. 10 is a block diagram of an example computer system in which implementations of the present disclosure can operate.

FIG. 10 illustrates an example machine of a computer system 1000 within which a set of instructions, for causing the machine to perform any one or more of the methodologies discussed herein, can be executed. In some embodiments, the computer system 1000 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the control logic 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a data storage system 1018, which communicate with each other via a bus 1030.

Processing device 1002 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 can also be one or more special-purpose processing devices such as an application specific integrated circuit (ASIC), a field programmable gate array (FPGA), a digital signal processor (DSP), network processor, or the like. The processing device 1002 is configured to execute instructions 1026 for performing the operations and steps discussed herein. The computer system 1000 can further include a network interface device 1008 to communicate over the network 1020.

The data storage system 1018 can include a machine-readable storage medium 1024 (also known as a computer-readable medium) on which is stored one or more sets of instructions 1026 or software embodying any one or more of the methodologies or functions described herein. The instructions 1026 can also reside, completely or at least partially, within the main memory 1004 and/or within the processing device 1002 during execution thereof by the computer system 1000, the main memory 1004 and the processing device 1002 also constituting machine-readable storage media. The machine-readable storage medium 1024, data storage system 1018, and/or main memory 1004 can correspond to the memory sub-system 110 of FIG. 1.

In one embodiment, the instructions 1026 include instructions to implement functionality corresponding to directing different power sources (e.g., control logic 113 of FIG. 1). While the machine-readable storage medium 1024 is shown in an example embodiment to be a single medium, the term "machine-readable storage medium" should be taken to include a single medium or multiple media that store the one or more sets of instructions. The term "machine-readable storage medium," or equally "non-transitory computer readable medium," shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus comprising:
    a voltage regulator coupled with a first voltage source, the first voltage source to supply power to core memory circuitry of a memory device;
    a first transistor coupled between an output of the voltage regulator and input/output (I/O) circuitry of the memory device;
    a second transistor coupled between a second voltage source and the I/O circuitry, the second voltage source to power a set of I/O buffers; and
    control logic coupled with gates of the first transistor and the second transistor, the control logic to perform operations comprising:
        causing the second transistor to be activated to permit current to flow from the second voltage source to the I/O circuitry;
        in response to detecting a current draw from the I/O circuitry that satisfies a first threshold criterion, causing the first transistor to be activated; and
        causing the second transistor to be deactivated over a time interval during which the I/O circuitry is powered by the first voltage source and the second voltage source.

2. The apparatus of claim 1, wherein the first voltage source supplies a higher voltage than the second voltage source.

3. The apparatus of claim 1, further comprising a comparator with inputs from a drain and a source of the second transistor, wherein the comparator provides an output signal to the control logic indicating whether the first threshold criterion is satisfied.

4. The apparatus of claim 3, wherein, to be deactivated over the time interval, the second transistor is ramped linearly from being fully activated to being fully deactivated, and wherein the operations further comprise:
    changing a threshold voltage for tripping the comparator to a value less than zero in response to causing the second transistor to be deactivated over the time interval; and
    in response to the comparator detecting that the value less than zero, causing the second transistor to be fully deactivated.

5. The apparatus of claim 1, wherein, after the second transistor is fully deactivated, the operations further comprise:
    detecting a drop in the current draw of the I/O circuitry that satisfies a second threshold criterion;
    causing the first transistor to be fully deactivated; and
    causing the second transistor to be fully activated.

6. The apparatus of claim 5, further comprising a comparator with inputs from a drain and a source of the first transistor, wherein the comparator provides an output signal to the control logic indicating whether the second threshold criterion is satisfied.

7. The apparatus of claim 1, wherein the first transistor and the second transistor are each an n-type complementary metal-oxide-semiconductor (NMOS) transistor.

8. A system comprising:
    a first voltage source to supply power to core memory circuitry of a memory device;
    a voltage regulator coupled with the first voltage source;
    a first transistor coupled between an output of the voltage regulator and input/output (I/O) circuitry;
    a second voltage source to supply power to a set of I/O buffers of the memory device, the first voltage source providing a higher voltage than that of the second voltage source;
    a second transistor coupled between the second voltage source and the I/O circuitry; and
    control logic coupled with gates of the first transistor and the second transistor, the control logic to perform operations comprising:
        causing the second transistor to be activated to permit current to flow from the second voltage source to the I/O circuitry;
        in response to detecting a current draw from the I/O circuitry that satisfies a first threshold criterion, causing the first transistor to be activated; and
        causing the second transistor to be deactivated over a time interval during which the I/O circuitry is powered by the first voltage source and the second voltage source.

9. The system of claim 8, wherein the voltage regulator comprises an operational amplifier, further comprising a voltage divider coupled between the second voltage source and a positive input terminal of the operational amplifier, wherein a top resistor of the voltage divider is adjustable with a trim value to set an offset cancellation of the operational amplifier that is within at least one percent of a voltage of the second voltage source.

10. The system of claim 8, further comprising a comparator with inputs from a drain and a source of the second transistor, wherein the comparator provides an output signal to the control logic indicating whether the first threshold criterion is satisfied.

11. The system of claim 10, wherein, to be deactivated over the time interval, the second transistor is ramped linearly from being fully activated to being fully deactivated, and wherein the operations further comprise:
    changing a threshold voltage for tripping the comparator to a value less than zero in response to causing the second transistor to be deactivated over the time interval; and
    in response to the comparator detecting that the value less than zero, causing the second transistor to be fully deactivated.

12. The system of claim 8, wherein, after the second transistor is fully deactivated, the operations further comprise:
    detecting a drop in the current draw of the I/O circuitry that satisfies a second threshold criterion;
    causing the first transistor to be fully deactivated; and
    causing the second transistor to be fully activated.

13. The system of claim 12, further comprising a comparator with inputs from a drain and a source of the first transistor, wherein the comparator provides an output signal to the control logic indicating whether the second threshold criterion is satisfied.

14. The system of claim 8, wherein the first transistor and the second transistor are each an n-type complementary metal-oxide-semiconductor (NMOS) transistor.

15. A method comprising:
    causing, using a first voltage source, core memory circuitry of a memory device to be powered;
    causing, using a second voltage source, a set of input/output (I/O) buffers of the memory device to be powered;
    causing, by control logic of the memory device, upon startup of the memory device, a first transistor to be activated, the first transistor coupled between the second voltage source and I/O circuitry of the memory device;

causing, by the control logic, in response to detecting a current draw from the I/O circuitry that satisfies a first threshold criterion, a second transistor to be activated, the second transistor coupled between a voltage regulator of the first voltage source and the I/O circuitry; and causing, by the control logic, the first transistor to be deactivated over a time interval during which the I/O circuitry is powered by the first voltage source and the second voltage source.

16. The method of claim 15, further comprising setting, by the control logic after the startup of the memory device, a threshold voltage of a comparator to the first threshold criterion, the comparator having inputs from a drain and a source of the first transistor.

17. The method of claim 15, further comprising receiving, by the control logic, a state of a comparator indicative of the first threshold criterion being satisfied, the comparator having inputs from a drain and a source of the first transistor.

18. The method of claim 17, wherein causing the first transistor to be deactivated over the time interval comprises causing the first transistor to be ramped linearly from being fully activated to being fully deactivated, further comprising:

changing, by the control logic, in response to causing the first transistor to be deactivated over the time interval, a threshold voltage for tripping the comparator to a value less than zero; and causing, in response to the comparator detecting that the value less than zero, the first transistor to be fully deactivated.

19. The method of claim 15, further comprising:

detecting, by the control logic after the first transistor is fully deactivated, a drop in the current draw of the I/O circuitry that satisfies a second threshold criterion;

causing the second transistor to be fully deactivated; and causing the first transistor to fully be fully activated.

20. The method of claim 19, further comprising receiving, by the control logic, a state of a comparator indicating whether the second threshold criterion is satisfied, the comparator having inputs from a drain and a source of the second transistor.

* * * * *